(12) United States Patent
Lee et al.

(10) Patent No.: US 6,210,518 B1
(45) Date of Patent: Apr. 3, 2001

(54) METHOD AND FIXTURE FOR MANUFACTURING FLEXIBLE PRINTED CIRCUIT BOARD

(75) Inventors: Sung Gue Lee; Hyung Kun Kim, both of Osan (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/332,080

(22) Filed: Jun. 14, 1999

(30) Foreign Application Priority Data

Sep. 11, 1998 (KR) .................................................. 98-37599

(51) Int. Cl.[7] ....................................................... B32B 31/00
(52) U.S. Cl. ........................... 156/289; 156/247; 156/249; 156/273.9; 156/275.7
(58) Field of Search ............................. 428/202; 156/247, 156/278, 289, 51, 230, 249, 273.9, 275.7

(56) References Cited

FOREIGN PATENT DOCUMENTS 61-183998 * 8/1986 (JP) .
5218616 * 8/1993 (JP) .

* cited by examiner

Primary Examiner—Merrick Dixon

(57) ABSTRACT

A method for manufacturing a flexible printed circuit board having high productivity by making a flexible sheet rigid so that a process for manufacturing the flexible printed circuit board can be carried out on a rigid printed circuit board manufacturing system, includes: a laminating step of sequentially laminating a releasing member and sheets on one or both sides of an adhesive member, and adhering outer margins of the sheets to the adhesive member; an outer shaping step of cutting along both ends of the sheets, and a hole forming step of making holes for forming a circuit; a printed circuit board manufacturing step which is performed in the rigid printed circuit board manufacturing system; and a board separating step of separating the sheets from the adhesive member, and completing the flexible printed circuit board.

19 Claims, 5 Drawing Sheets

METHOD AND FIXTURE FOR MANUFACTURING FLEXIBLE PRINTED CIRCUIT BOARD

BACKGROUND OF THE INVENTION

1. Field of the Invention

The present invention relates to a method for manufacturing a flexible printed circuit board (PCB), and in particular to a method and fixture for manufacturing a flexible printed circuit board by employing a rigid printed circuit board manufacturing system without requiring a special manufacturing system.

2. Description of the Background Art

In general, types of printed circuit boards (hereinafter, referred to as 'PCB's) are classified into a rigid type of PCB made of phenol, epoxy and the like, and a flexible type of PCB made of polyimide.

There have been known various methods for manufacturing the rigid type PCB. The rigid type PCB is typically manufactured by transferring sheets of a rigid raw material on a conveyer and by carrying out a stacking or laminating step, a circuit forming step, a metal plating step and a cleaning step thereon.

FIG. 1 is a schematic process view illustrating a conventional method for manufacturing a flexible type PCB by using a flexible PCB manufacturing system.

The flexible PCB is manufactured of a soft raw material having a thickness of approximately 0.1 mm which may be easily bent. Accordingly, as shown in FIG. 1, the flexible PCB is manufactured by a manufacturing process called a reel-to-reel or roll-to-roll process which is one of the known flexible PCB manufacturing methods.

That is, a flexible sheet 10 is consecutively moved from a supply reel (S) to a take-up reel (T), a copper foil (not shown) being stacked or laminated onto at one or both surfaces of the flexible sheet 10, and passed through a manufacturing system 20, thereby manufacturing the flexible PCB.

However, the flexible sheet 10 is easily bent or twisted during the manufacturing process, thus reducing productivity.

In addition to the rigid PCB manufacturing system that has been popularly used, a special system is necessary to perform the conventional method for manufacturing the flexible PCB.

Accordingly, the following method is employed so that the flexible PCB can be manufactured by using merely the rigid PCB manufacturing system without requiring an additional specialized system.

FIG. 2 is a plan view illustrating a constitution for manufacturing a conventional flexible PCB using the rigid PCB manufacturing system, and FIG. 3 is a cross-sectional view taken along line III-III' in FIG. 2.

Referring to FIGS. 2 and 3, the flexible sheet 10 is adhered to a supporting plate 40 with an adhesive 30, and then the manufacturing process is carried out using the rigid PCB manufacturing system.

However, when the flexible sheet 10 is adhered to the supporting plate 40, the adhesive 30 is applied to the entire surface of both sides of the flexible sheet 10. As a result, the flexible sheet 10 may be undesirably bent or curved when it is separated from the supporting plate 40.

In addition, the adhesive 30 remains on the surface of the flexible sheet 10, and thus it is necessary to remove the remaining adhesive by a special removing process. Accordingly, the number of the processes is increased.

While the flexible sheet 10 is adhered to the supporting plate 40, if the flexible sheet 10 is not sufficiently flat, it is difficult to exactly form a circuit. As a result, inferior products are manufactured, and thus productivity is decreased.

SUMMARY OF THE INVENTION

It is therefore a primary object of the present invention to provide a method and fixture for manufacturing a flexible printed circuit board having high productivity by making a flexible sheet rigid so that manufacturing of the flexible printed circuit board can be carried out on a rigid printed circuit board manufacturing system.

It is another object of the present invention to provide a method and fixture for manufacturing a flexible printed circuit board which forms a conductive circuit at a central portion of a flexible sheet, in a state where the flexible sheet is adhered to a rigid board except at its central portion where the conductive circuit is formed.

It is still another object of the present invention to provide a method and fixture for manufacturing a flexible printed circuit board which is capable of manufacturing two flexible printed circuit boards by performing a manufacturing process once.

It is still another object of the present invention to provide a method and fixture for manufacturing a flexible printed circuit board which can improve stability in size and flatness by preventing a flexible sheet from being shrunk or expanded due to heat or moisture generated during the manufacturing process.

In order to achieve the above-described objects of the present invention, there is provided a method for manufacturing a flexible printed circuit board by using a rigid printed circuit board manufacturing system, including: a laminating step of sequentially laminating a releasing member and a flexible sheet on one or both sides of an adhesive member, and adhering an outer margin of each flexible sheet to the adhesive member; an outer shape processing step of performing cutting along both ends of each flexible sheet, and a hole forming step of making holes in each flexible for forming a circuit; a printed circuit board manufacturing step which is performed in the rigid printed circuit board manufacturing system; and a board separating step of separating each flexible sheet from the adhesive member, and completing the flexible printed circuit board. These steps are sequentially carried out.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A method and fixture for manufacturing a flexible printed circuit board (hereinafter, referred to as a 'PCB') in accordance with the present invention will now be described with reference to the accompanying drawings.

Figure 1:
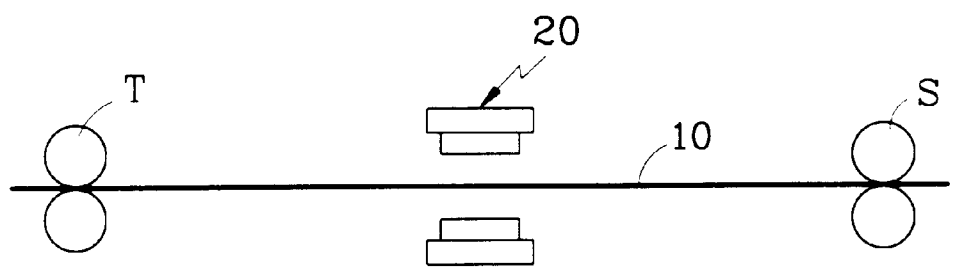
FIG. 1 is a process view illustrating a conventional method for manufacturing a flexible printed circuit board.
Figure 2:
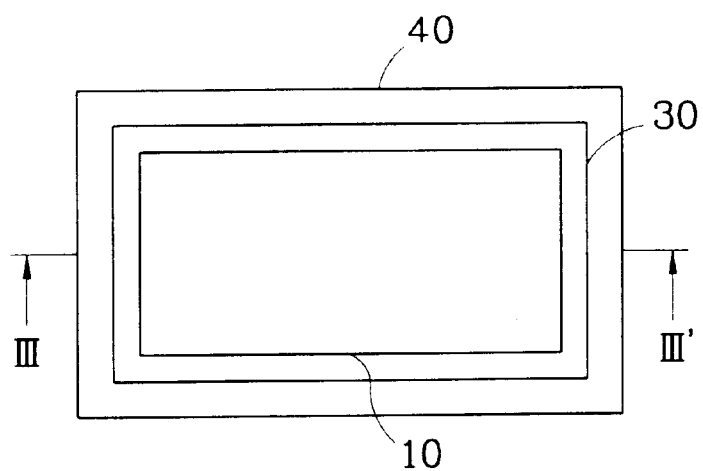
FIG. 2 is a plan view illustrating a constitution for manufacturing a conventional flexible printed circuit board in a rigid printed circuit board manufacturing system.
Figure 3:
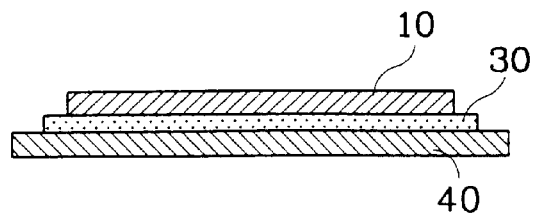
FIG. 3 is a cross-sectional view taken along line III-III' in FIG. 2.
Figure 4:
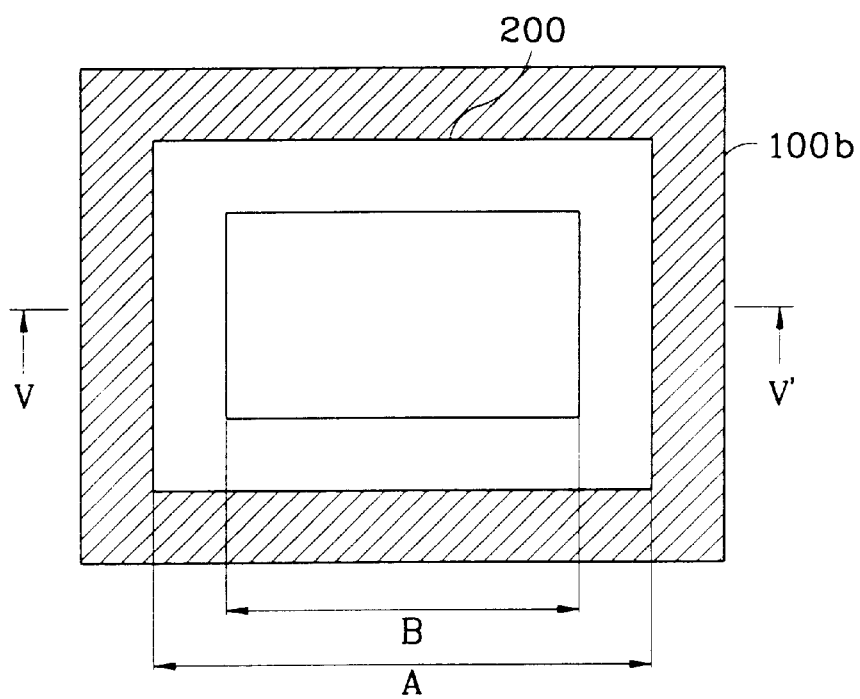
FIG. 4 is a plan view illustrating a fixture in accordance with a method for manufacturing a flexible printed circuit board of the present invention.
Figure 5:
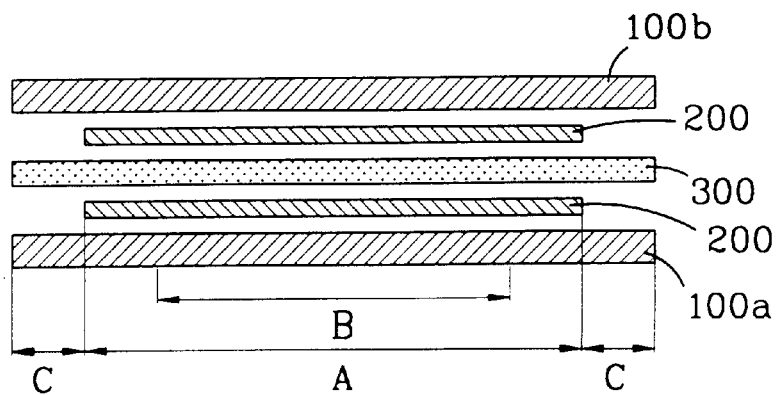
FIG. 5 is a cross-sectional view taken along line V-V' in FIG. 4.

FIG. 4 is a plan view illustrating a fixture according to the method for manufacturing the flexible PCB of the present invention, and FIG. 5 is a cross-sectional view taken along line V-V' in FIG. 4.

The fixture for manufacturing the flexible PCB according to the present invention will now be explained with reference to FIGS. 4 and 5, before describing the method for manufacturing the flexible PCB according to the present invention.

According to the present invention, a flexible PCB can advantageously be manufactured by using a conventional rigid PCB manufacturing system. A prepreg 300 is positioned as an adhesive member between sheets 100a, 100b formed by laminating a copper foil (not shown) onto one side or both sides of an intermediate sheet (not shown) made of polyimide. A releasing member 200 is positioned above and below the prepreg 300. The outer margins of the sheets 100a, 100b where a conductive circuit will not be formed are adhered to the adhesive prepreg 300, and then a manufacturing process is performed using the conventional rigid PCB manufacturing system.

Here, the releasing member 200 may be in the form of a sheet, liquid, powder and the like. A releasing sheet 200 is for example employed according to the present invention.

The releasing sheet 200 prevents the sheets 100a, 100b from being adhered to the prepreg 300. Accordingly, the completed flexible PCB can be easily separated from the prepreg 300 which becomes a rigid board.

As a result, the prepreg 300 is formed by drying once an insulation polymer material having an adhesive power at a thin and even thickness before starting a polymer reaction.

Here, in adhering the sheets 100a, 100b in a state where the releasing sheets 200 are positioned above and below the prepreg 300, as illustrated in FIGS. 4 and 5, a region indicated at 'A' is a region where the releasing sheet 200 is positioned, a region indicated at 'B' is a region of the sheets 100a, 100b where the conductive circuit is to be formed, and a marginal region indicated at 'C' is a region where the sheets 100a, 100b are adhered to the prepreg 300. It is preferable to form the region (A) wider than the region (B) where the conductive circuit is to be formed.

In this state, when pressure and heat are applied above and below the sheets 100a, 100b at the same time, the prepreg 300 is changed into a gel phase due to the heat and pressure, and then becomes a rigid board. As a result, the outer marginal portions of the flexible sheets 100a, 100b are adhered to the prepreg 300 which becomes the rigid board after removing the heat and pressure, and thus have a sufficient stiffness and strength to resist bending.

Accordingly, the sheets 100a, 100b are in a similar condition to a single rigid PCB, and thus are not liable to be bent or twisted, so that the manufacturing process can thereafter be performed using the rigid PCB manufacturing system.

The method for manufacturing the flexible PCB in accordance with the present invention will now be described in more detail with reference to FIGS. 6, 7 and 10.

Figure 6:
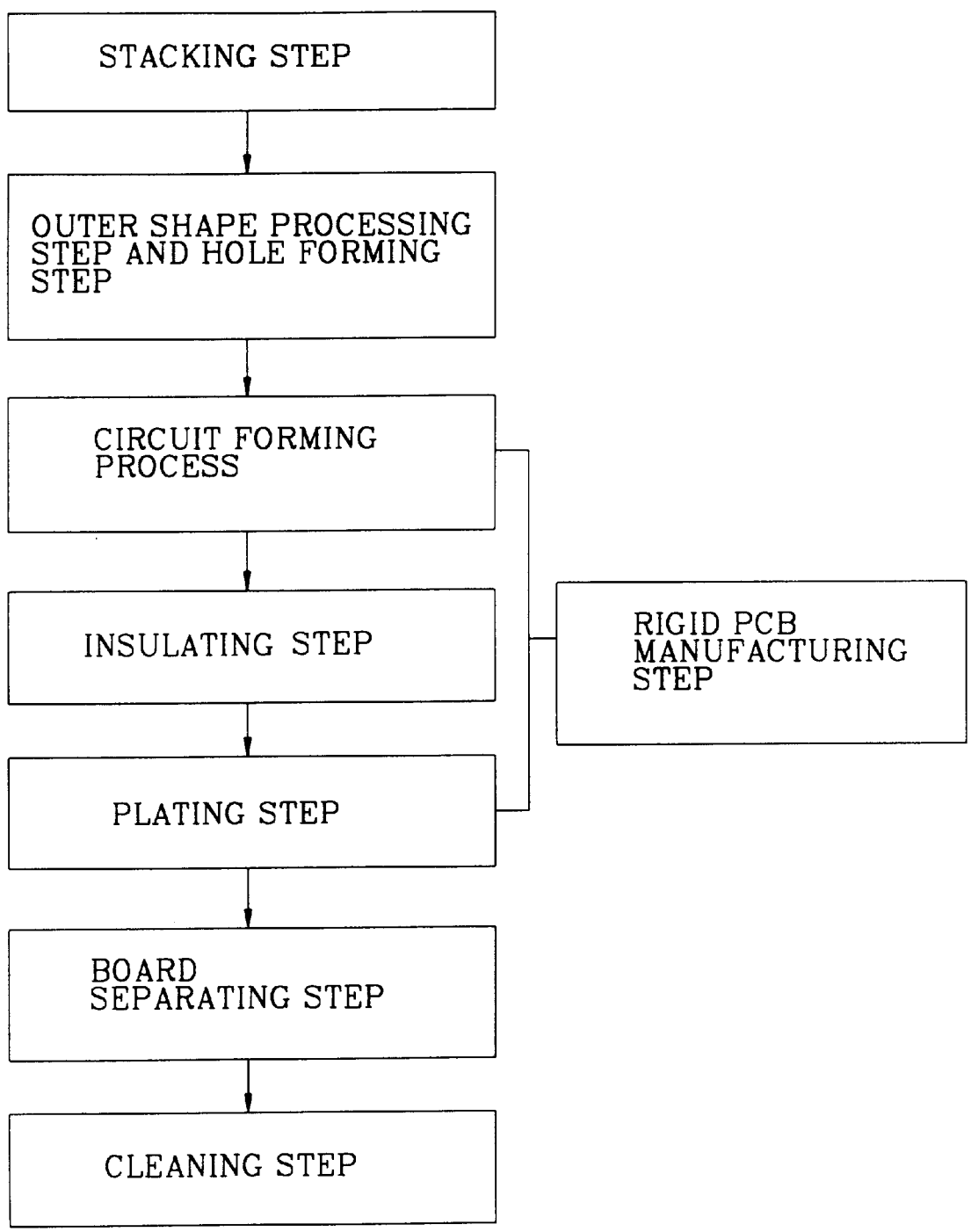
FIG. 6 is a process flowchart showing steps of the method for manufacturing the flexible printed circuit board according to the present invention.
Figure 7:
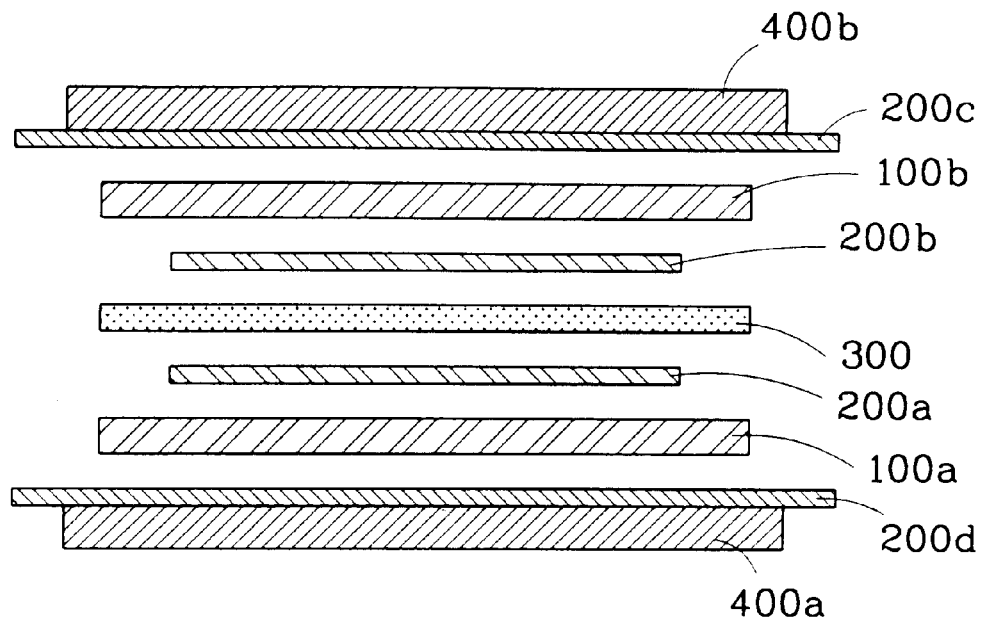
FIG. 7 is a process view illustrating a stacking order for manufacturing the flexible printed circuit board according to the present invention.
Figure 10:
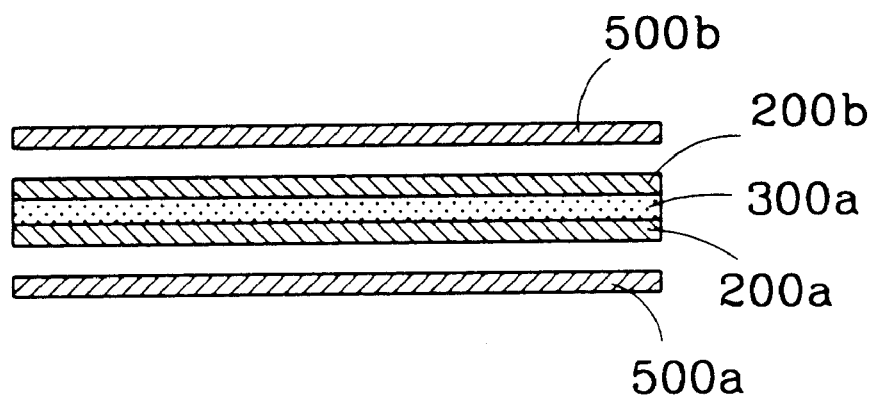
FIG. 10 is a cross-sectional view illustrating the completed flexible printed circuit board produced by the method for manufacturing a flexible printed circuit board according to the present invention.

FIG. 6 is a process flowchart illustrating a process order for manufacturing the flexible PCB according to the present invention, and FIGS. 7 and 10 are process views illustrating embodiments of the present invention.

Stacking Step

Referring to FIG. 7, in a laminating step, first and second releasing sheets 200b, 200a, first and second sheets 100b, 100a, and third and fourth releasing sheets 200c, 200d are sequentially stacked between upper and lower rigid supporting plates 400a, 400b, centering around the prepreg 300.

That is, the first releasing sheet 200b is positioned above the prepreg 300, and the second releasing sheet 200a is positioned below the prepreg 300. The first sheet 100b is positioned above the first releasing sheet 200b, and the second sheet 10a is positioned below the second releasing sheet 200a.

The third releasing sheet 200c is positioned above the first sheet 100b, and the fourth releasing sheet 200d is positioned below the second sheet 100a. The rigid plates 400a, 400b are respectively positioned above the third releasing sheet 200c and below the fourth releasing sheet 200d.

The third and fourth releasing sheets 200c, 200d prevent the sheets 100a, 100b from directly contacting the upper and lower rigid supporting plates 400a, 400b, and enable the upper and lower rigid supporting plates 400a, 400b to be easily separated.

The prepreg 300 is almost identical in size to the sheets 100a, 100b. The third and fourth releasing sheets 200c, 200d positioned between the sheets 100a, 100b and the upper and lower rigid supporting plates 400a, 400b are greater in size than the upper and lower rigid supporting plates 400a, 400b. The first and second releasing sheets 200b, 200a positioned between the sheets 100a, 100b and the prepreg 300 are smaller in size than the sheets 100a, 100b, thereby allowing the outer marginal portions of the sheets 100a, 100b to adhere to the prepreg 300.

Figure 8:
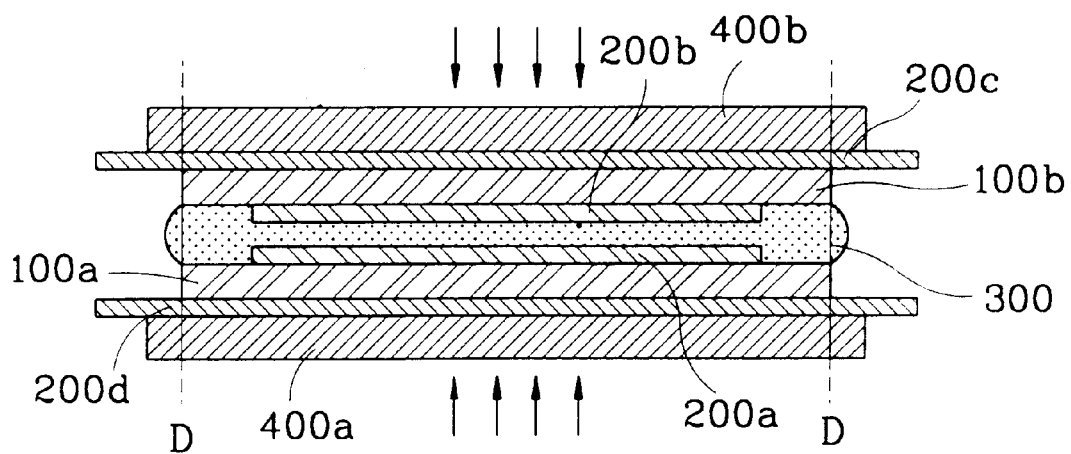
FIG. 8 is a process view illustrating a laminating step in the method for manufacturing the flexible printed circuit board according to the present invention.

In this state, as shown in FIG. 8, when heat and pressure are simultaneously applied by a flat plate-type press to the upper and lower portions of the upper and lower rigid plates 400a, 400b, the prepreg 300 is melted. Here, the portions of the sheets 100a, 100b where the first and second releasing sheets 200a, 200b are positioned are not directly contacted to the prepreg 300. The outer marginal portions of the sheets 100a, 100b where the first and second releasing sheets 200a, 200b are not positioned are directly contacted with and adhered to the prepreg 300. At the same time, the sheets 100a, 100b are spread under as much tension as possible.

In the case that the sheets 100a, 100b have the tension of a predetermined degree, their flatness is maintained at a predetermined value. It is thus prevented that the sheets 100*a*, 100*b* become bent, twisted, shrunk or expanded due to moisture or heat during the subsequent processing. Accordingly, it is possible to form an exact circuit which is stable in size.

As described above, after the sheets 100*a*, 100*b* are adhered to the prepreg 300, the prepreg 300 is made to be rigid, and thus becomes a rigid board 300*a*. Thereby, the laminating step is completed.

Outer Shape Processing Step and Hole Forming Step

When the laminating step is completed, in order to manufacture the flexible PCB using the general rigid PCB manufacturing system, an outer shape processing step and a hole forming step of forming through holes or blind holes are carried out.

Referring to FIG. 8, the prepreg 300 becomes molten, flowing out to the edges of the sheets 100*a*, 100*b*, and then is made to be rigid. The outer shape processing step of cutting the rigid portion along cutting line D-D' is then performed.

Here, the outer shape processing step is performed after the upper and lower rigid supporting plates 400*a*, 400*b* and the third and fourth releasing sheets 200*c*, 200*d* are removed. The upper and lower rigid supporting plates 400*a*, 400*b* are easily separated from the sheets 100*a*, 100*b* by virtue of the third and fourth releasing sheets 200*c*, 200*d*.

Thereafter, the hole forming step of making the through holes (not shown) and the blind holes (not shown) for forming a circuit is carried out.

Circuit Forming Step

Figure 9:
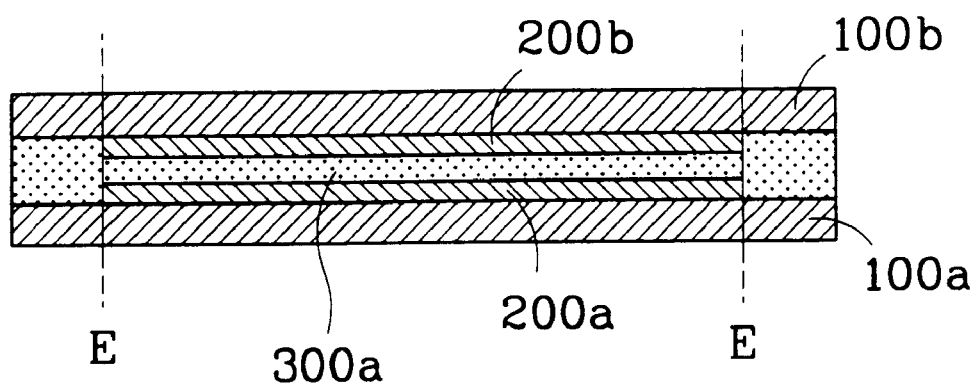
FIG. 9 is a process view illustrating a cutting step in the method for manufacturing the flexible printed circuit board according to the present invention.

FIG. 9 illustrates a state where the outer shape processing step and the hole forming step are carried out. From this stage forward, an identical processing to that employed for manufacturing the general rigid PCB is performed in the rigid PCB manufacturing system.

That is, a circuit forming step of forming a printed circuit pattern on the surfaces of the sheets 100a, 100b is carried out.

Insulating Step

Thereafter, in order to improve an insulation property of the circuit, protect the circuit from damage and prevent the circuit traces from being adjacent and electrically connected due to a spread lead, an insulation ink or film is spread or printed.

Plating Step

After the insulating step is completed, in order to enhance a wire bonding strength and solderability, a plating step normally carried out in a packaging process such as for a semiconductor device is performed.

Board Separating Step

After the circuit pattern is formed on the sheets 100*a*, 100*b*, cutting is performed along a cutting line E—E as shown in FIG. 9, and a board separating step for completing the flexible PCB is carried out.

The sheets 100*a*, 100*b* are separated by removing the marginal portions thereof adhered to the prepreg 300.

That is, the board separating step is carried out along the cutting line E-E' between the adhered sheets 100*a*, 100*b* and prepreg 300 and the first and second releasing sheets 200*b*, 200*a*, or carried out at the inner portions of the first and second releasing sheets 200*b*, 200*a*.

When cutting is completed, as depicted in FIG. 10, the sheets 100*a*, 100*b* are separated from the first and second releasing sheets 200*b*, 200*a*, and thus the flexible PCBs 500*a*, 500*b* are manufactured.

Cleaning Step

Thereafter, a cleaning step is carried out on the surfaces of the flexible PCBs 500*a*, 500*b* in order to remove foreign substances therefrom.

The flexible PCBs 500*a*, 500*b* are thus completed by the above-described steps.

Here, the order of the board separating step and the cleaning step may be exchanged, if required.

As discussed earlier, the method for manufacturing the flexible PCB in accordance with the present invention employs the conventional system for manufacturing the rigid PCB, and thus does not incur an additional cost. Besides, the flexible PCB may be selectively manufactured in the same facility.

In addition, two flexible PCBs can be manufactured by performing the manufacturing process only once, thereby increasing productivity.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method, for use in manufacturing a flexible printed circuit board, comprising:

providing an adhesive member;

positioning a releasing member at one or both sides of the adhesive member; and positioning a sheet of flexible PCB material on the releasing member, the sheet being located such that a portion thereof extends beyond at least one edge of the releasing member to contact the adhesive member.

2. The method according to claim 1, wherein the releasing member is formed smaller in area than the adhesive member and sheet, and the releasing member is centrally located relative to the adhesive member and the sheet such that peripheral portions of the adhesive member and the sheet contact each other.

3. A method, for manufacturing a flexible printed circuit board by employing a rigid printed circuit board manufacturing system, comprising:

a laminating step for sequentially laminating a releasing member and a sheet on one or both sides of an adhesive member, and adhering an outer margin of each sheet to the adhesive member;

an outer shaping step for performing a cutting along both ends of each sheet;

a hole forming step for forming holes in each sheet for forming a circuit;

a printed circuit board manufacturing step which is performed in a rigid printed circuit board manufacturing system; and a board separating step for separating each sheet from the adhesive member and thereby completing the flexible printed circuit board.

4. The method according to claim 3, wherein the printed circuit board manufacturing step performed in the rigid printed circuit board manufacturing system comprises:

a circuit forming step for forming a printed circuit pattern on the surface of each sheet after the outer shaping step and hole forming step;

an insulating step for applying an insulation to each sheet for preventing the thusly formed printed circuits from being electrically connected to each other and for improving an insulation property of the flexible printed circuit board; and a plating step for strengthening a wire bonding power of the flexible printed circuit board.

5. The method according to claim 3, further comprising a cleaning step for cleaning the surface of the flexible printed circuit board.

6. The method according to claim 3, wherein pressure and a heat are simultaneously applied above and below the sheet, whereby the adhesive member is caused to be adhered to the outer margin of each sheet, and a tension is provided to each sheet in the laminating step.

7. The method according to claim 6, wherein pressure is applied above and below the sheets by rigid plates in the laminating step, the releasing members being respectively adhered to inner portions of the rigid plates.

8. The method according to claim 3, wherein cutting is performed along both edges of the releasing members, and the sheets are separated from the adhesive member in the board separating step.

9. The method according to claim 3, wherein the sheets are separated from the adhesive member by cutting the inner portions of both edges of the releasing member.

10. The method according to claim 3, wherein the releasing member is identical in area to portions of the sheets where the flexible printed circuit board is to be formed, and the outer margin of each sheet is adhered to the adhesive member.

11. The method according to claim 3, wherein the adhesive member is identical in area to the sheets, and the releasing member is formed smaller in area than the sheets, the outer margins of the sheets being adhered to the adhesive member, the portion of each sheet where the releasing member is positioned not being adhered to the adhesive member.

12. The method according to claim 3, wherein the adhesive member is formed by drying once a material having an adhesive power at a thin and even thickness before starting a polymer reaction.

13. The method according to claim 3, wherein the adhesive material is a prepreg.

14. A fixture, for use in manufacturing a flexible printed circuit board, comprising:

an adhesive member;

a releasing member positioned at one or both sides of the adhesive member; and a sheet of flexible PCB material positioned on the releasing member, the sheet being located such that a portion thereof extends beyond at least one edge of the releasing member to contact the adhesive member.

15. The fixture according to claim 14, wherein the releasing member is formed smaller in area than the adhesive member and sheet, and the releasing member is centrally located relative to the adhesive member and the sheet such that peripheral portions of the adhesive member and the sheet contact each other.

16. The method according to claim 2, further comprising forming a conductive circuit on each sheet.

17. The fixture according to claim 15, further comprising a conductive circuit formed on each sheet.

18. The method according to claim 2, wherein the adhesive member and the sheet are substantially the same in area.

19. The fixture according to claim 15, wherein the adhesive member and the sheet are substantially the same in area.

* * * * *